United States Patent
Lammert

(10) Patent No.: US 6,475,400 B2
(45) Date of Patent: Nov. 5, 2002

(54) METHOD FOR CONTROLLING THE SHEET RESISTANCE OF THIN FILM RESISTORS

(75) Inventor: Michael D. Lammert, Manhattan Beach, CA (US)

(73) Assignee: TRW Inc., Redondo Beach, CA (US)

( * ) Notice: Subject to any disclaimer, the term of this patent is extended or adjusted under 35 U.S.C. 154(b) by 52 days.

(21) Appl. No.: 09/793,252

(22) Filed: Feb. 26, 2001

(65) Prior Publication Data

US 2002/0117470 A1 Aug. 29, 2002

(51) Int. Cl.$^7$ .............................. B44C 1/22; C23F 1/00
(52) U.S. Cl. ............................. 216/16; 216/13; 216/59; 216/75; 216/84; 216/100; 438/8; 438/742; 438/754
(58) Field of Search ............................. 216/13, 16, 37, 216/59, 75, 84, 100; 438/8, 720, 742, 754

(56) References Cited

U.S. PATENT DOCUMENTS

| | | |
|---|---|---|
| 3,661,761 A | 5/1972 | Koenig |
| 4,707,909 A | 11/1987 | Blanchard |
| 5,152,869 A | 10/1992 | Ferraris et al. |
| 5,233,327 A | 8/1993 | Bartush et al. |
| 5,266,529 A | 11/1993 | Lau et al. |
| 5,494,845 A | 2/1996 | Sereda et al. |
| 5,525,831 A | 6/1996 | Ohkawa et al. |
| 5,779,922 A | 7/1998 | Boon et al. |
| 6,191,026 B1 | 2/2001 | Rana et al. |

FOREIGN PATENT DOCUMENTS

| | | |
|---|---|---|
| EP | 0070809 | 1/1983 |
| GB | 2207546 A | 3/1988 |

OTHER PUBLICATIONS

"In Situ-Trimmed Fine-Grained Polysilicon Resistors," IBM Technical Disclosure Bulletin, vol. 33, No. 5, pp. 280–281, Oct. 1990.

Primary Examiner—William A. Powell
(74) Attorney, Agent, or Firm—Antonelli, Terry, Stout & Kraus LLP

(57) ABSTRACT

A method for controlling the sheet resistance of thin film resistors. The sheet resistance can be inexpensively controlled within a tight tolerance by determining a desired final value for the sheet resistance of thin film resistor material to be deposited on a substrate, depositing the resistor material on the substrate using a deposition process which is consistent enough to achieve a target sheet resistance within a first specified tolerance, the resistor material being deposited to achieve a target sheet resistance which is equal to the desired final value minus the first specified tolerance, and removing a small amount of material from the surface of the deposited thin film resistor material by etching or ion bombardment to raise the sheet resistance to the desired final value within a second specified tolerance characteristic of the removing process where the second specified tolerance is less than the first specified tolerance.

14 Claims, 1 Drawing Sheet

METHOD FOR CONTROLLING THE SHEET RESISTANCE OF THIN FILM RESISTORS

TECHNICAL FIELD

A method for producing thin film resistors to a tighter sheet resistance specification.

BACKGROUND AND SUMMARY

Thin film resistors are used in most GaAs and InP devices and integrated circuit fabrication processes, in thin-film substrate manufacturing, and in some Si processes. The resistor sheet resistance typically has a specified tolerance of ±15%, although with special care in fabricating the thin film resistors, the resistor sheet can be controlled to ±10%. However, for many integrated circuit designs it would be of a great advantage to be able to control the sheet resistance to a much tighter tolerance. This is especially true in very high speed integrated circuits where resistor values need to be controlled well in impedance matching circuitry.

One method of achieving tight control of the resistor sheet resistance is to re-process any thin film that does not have the desired sheet resistance by stripping the thin film and re-depositing it. However, such a procedure essentially doubles the cost of processing the thin film resistor. Therefore, a need exists for inexpensively controlling the sheet resistance of thin film resistors to within a tight tolerance of their targeted value.

The present invention addresses this need. More particularly, a disclosed method of the invention improves the tolerance of thin film resistors to within ±3% or better with minimum additional processing expense. To this end, the disclosed method for controlling the sheet resistance of thin film resistors comprises determining a desired final value for the sheet resistance of thin film resistor material to be deposited on a substrate. The thin film resistor material is deposited on the substrate using a deposition process which is consistent enough to achieve a target sheet resistance for the deposited thin film resistor material within a first specified tolerance. The thin film resistor material is deposited by the deposition process to achieve a target sheet resistance which is equal to the desired final value minus the first specified tolerance. A small amount of material is then removed from the surface of the deposited thin film resistor material by an etching or ion bombardment process to raise the sheet resistance to the desired final value within a second specified tolerance characteristic of the etching or ion bombardment process, where the second specified tolerance is less than the first specified tolerance. The etching process employed in a preferred embodiment uniformly removes material from the surface of the deposited thin film resistor by argon sputter etching.

According to the disclosed, preferred embodiment, the method further comprises, after the thin film resistor deposition, measuring the sheet resistance of the deposited thin film resistor material by measurement or calculation, determining the thickness of the deposited thin film resistor material, calculating the thickness of the deposited thin film resistor material needed to be removed to raise the sheet resistance to the desired final value, and calculating the time for performing the removing process to remove the calculated thickness needed to be removed based on a measured removal rate for the removing process. Further, the method includes patterning a thin film resistor from the thin film resistor material on the substrate. The patterning can be performed before or after the sheet resistance is raised to the desired final value. The invention advantageously permits the thin film resistor sheet resistance on critical integrated circuit designs to be controlled to better than ±3% with minimum additional processing expense.

These and other objects, features and advantages of the present invention will become more apparent from the following description of a preferred embodiment of the invention.

DETAILED DESCRIPTION

Figures 1A, 1B:
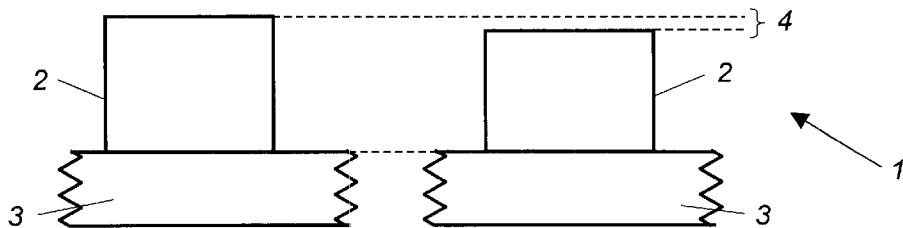
FIG. 1A is an enlarged side view of a substrate with a thin film resistor material deposited thereon according to the invention to achieve a target sheet resistance $R_s$ which is equal to a desired final value for the sheet resistance minus a specified tolerance of the deposition process.
FIG. 1B is an enlarged side view of the substrate with thin film resistor material of FIG. 1A after removal of a small amount of material uniformly from the surface of the thin film resistor material by argon sputter etching the material to raise the sheet resistance thereof to the desired final valve within a specified tolerance of the etching process.

Referring now to the drawings, a thin film resistor 1 made according to the method of the invention is depicted in FIG. 1B. The resistor 1 comprises a thin film resistor material 2 supported on a substrate/wafer 3. The thin film resistor can form part of a very high speed integrated circuit such as a GaAs or InP integrated circuit device. The method of the invention for forming the thin film resistor 1 includes first depositing the thin film resistor material 2 on the substrate 3 at a sheet resistance that is less than the desired final value. See FIG. 1A. The resistor material is deposited by evaporation or sputter deposition. For example, if the deposition process is consistent enough to achieve the target sheet resistance within ±10%, the thin film resistor material 2 is deposited at a sheet resistance equal to 90% of the desired final value. This results in all initial thin film sheet resistances being in a range of 80% to 100% of the desired final sheet resistance.

The sheet resistance is raised to its final value by etching, preferably using an Ar sputter etch or an ion bombardment to remove a small amount of material, the thickness of which is denoted at 4 in FIG. 1B, from the surface of the thin film resistor. This is accomplished by first measuring the thin film resistor sheet resistance, then etching the thin film resistor in the argon sputter etch for a time that has previously been calibrated. Since it is possible to controllably remove material in the argon sputter etch to within a few angstroms, the thin film resistor sheet resistance can be controlled routinely to within ±3% of its target value.

The resistor material 2 in the disclosed embodiment is NiCr, but the process is applicable to all types of thin film resistor material, such as other high resistivity materials including TaN, CrSi and CrSiO, as well as lower resistivity materials including Ti, $TiSi_2$, W, Mo, Au, Ag and various metals. The thickness of the thin film resistor material 2 can range from less than 50 Å to in excess of 50,000 Å. The initial sheet resistance of the deposited material 2 on the substrate in FIG. 1A can be greater than $10^6$ ohms/square to less than 0.1 ohm/square, depending upon the design criteria. The desired final value for the sheet resistance is whatever has been specified as the target value and as noted above has a typical specified tolerance of about ±15%, with an actual range of more like ±10%.

Argon is the preferred sputter etch gas, but the process of the invention is amenable to the use of any other gas which can remove the resistor material by etching or by ion bombardment. The argon sputter etch conditions are adjusted for the sputter etch system to provide a uniform etch at an etch rate that will take off the required amount of material in a reasonable time, e.g., within a range of about 10 seconds to several minutes. Conditions of the sputter etch vary considerably depending on whether the etch system is a single wafer machine or a batch machine. An example of ranges for typical process parameters are: power, tens of watts to greater than 1,000 watts; voltage, tens of volts to 100s of volts; pressure, tens of $\mu$Torr to several Torr; and gas flow, less than 10 cc/min to greater than 100 cc/min.

The parameters are preferably adjusted to remove less than 0.1% to greater than 3% of the total resistor material in about 10 seconds. Similar etch rates would be desirable for any other material used to ion bombard or chemically etch the thin film resistor material.

Figure 2:
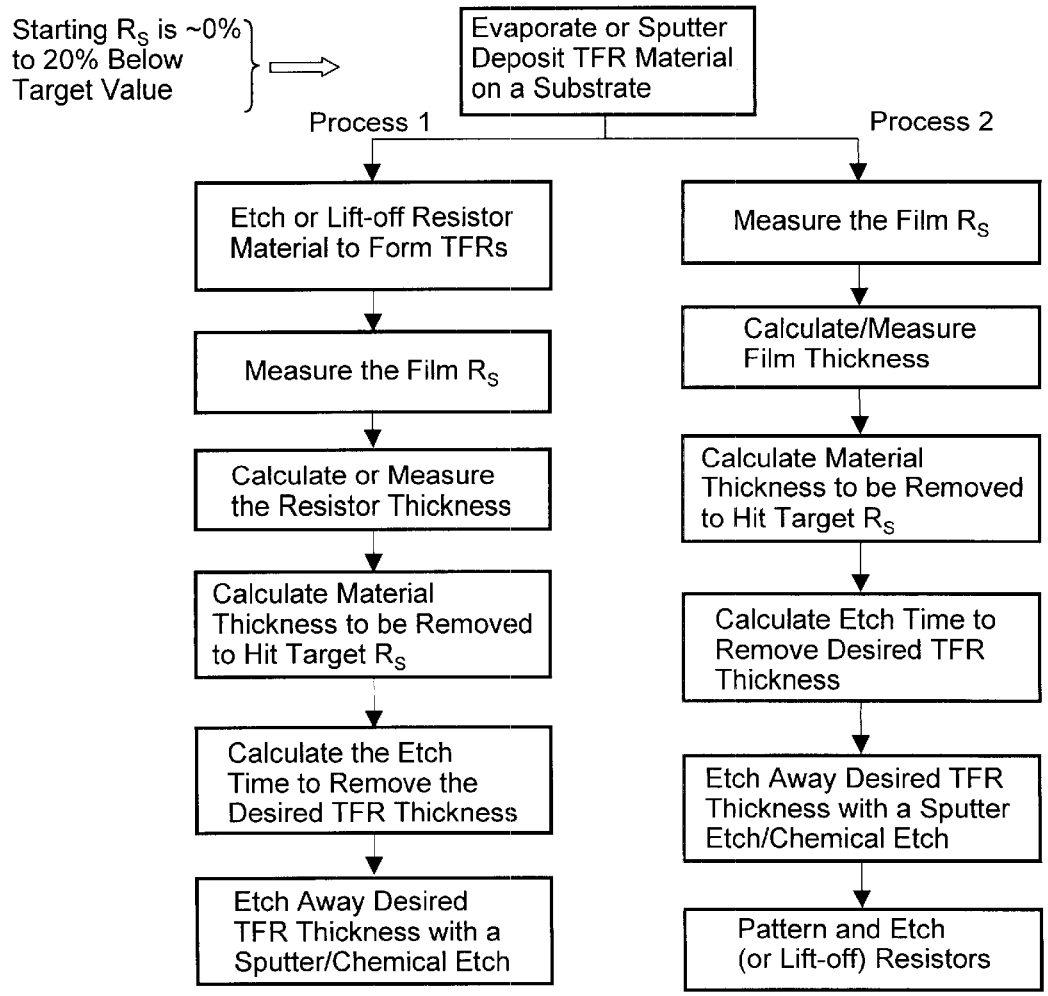
FIG. 2 is a flow chart of steps in a method of the invention, Process 1 on the left side being for the case where the resistor material is patterned before the sheet resistance is adjusted to within ±3% or better and Process 2, on the right side of the flow chart, being for the case where the resistor material is patterned after the sheet resistance is adjusted.

To establish a calibrated etch time to achieve a desired final thin film sheet resistance for the resistor 1 in FIG. 1B after deposition, the sheet resistance of the thin film resistor material 2 in FIG. 1A is measured. The thickness of the thin film resistance material in FIG. 1A is then determined, either by measurement or calculation based upon its thickness assuming a fixed resistivity. The thickness 4 of the resistance material that must be removed to achieve the final target sheet resistance value is then calculated. The time that the thin film resistor material 2 must be etched to remove the thickness 4 is then calculated based on the previously measured etch rate of the sputter etch (or chemical etch) employed for removing the resistor material. These steps are shown in the flow chart of FIG. 2. Process 1, depicted by thin film resistor cross sections in FIGS. 1A and 1B, therein indicates that the resistor can be patterned on the substrate before the sheet resistance is adjusted to within ±3% or better. Process 2 patterns the resistor after the sheet resistance is adjusted.

The method of the invention enables the integrated circuit manufacturer to control thin film resistor sheet resistance to within a tight tolerance of the target value with minimum additional processing expense. The invention can be used to control the sheet resistance of thin film resistors on any type of integrated circuit or substrate that uses thin film resistors in its circuitry.

While I have shown and described only one embodiment of the present invention herein, it will be readily understood by the skilled artisan that variations of the method for controlling the sheet resistance of thin film resistors are possible without departing from the scope of my invention. Therefore, I do not wish to be limited to the details shown and described herein but intend to cover all such chances and modifications as are encompassed by the scope of the appended claims.

I claim:

1. A method for controlling the sheet resistance of thin film resistors, comprising:

determining a desired final value for the sheet resistance of thin film resistor material to be deposited on a substrate, depositing said thin film resistor material on said substrate using a deposition process which is consistent enough to achieve a target sheet resistance for the deposited thin film resistor material within a first specified tolerance, said thin film resistor material being deposited by said deposition process to achieve a target sheet resistance which is equal to said desired final value minus said first specified tolerance, and removing a small amount of material from the surface of the deposited thin film resistor material by one of an etching and ion bombardment removing process to raise the sheet resistance to said desired final value within a second specified tolerance characteristic of said removing process, said second specified tolerance being less than said first specified tolerance.

2. The method according to claim 1, further comprising, after said depositing, measuring the sheet resistance of said deposited thin film resistor material, determining the thickness of said deposited thin film resistor material, calculating the thickness of said deposited thin film resistor material needed to be removed to raise the sheet resistance thereof to said desired final value, and calculating the time for performing said removing process to remove said calculated thickness based on a measured removal rate for said removing process.

3. The method according to claim 2, wherein said determining the thickness of said deposited thin film resistor material is accomplished by measuring the deposited thin film resistor material.

4. The method according to claim 2, wherein said determining the thickness of said deposited thin film resistor material is accomplished by calculation using said measured sheet resistance and a reference characteristic for said material relating thickness and sheet resistance.

5. A method for controlling the sheet resistance of thin film resistors, comprising:

determining a desired final value for the sheet resistance of thin film resistor material to be deposited on a substrate, depositing said thin film resistor material on said substrate using a deposition process which is consistent enough to achieve a target sheet resistance for the deposited thin film resistor material within a first specified tolerance, said thin film resistor material being deposited by said deposition process to achieve a target sheet resistance which is equal to said desired final value minus said first specified tolerance, and removing a small amount of material uniformly from the surface of the deposited thin film resistor material by one of an etching and ion bombardment removing process to raise the sheet resistance to said desired final value within a second specified tolerance characteristic of said removing process, said second specified tolerance being less than said first specified tolerance.

6. A method for controlling the sheet resistance of thin film resistors, comprising:

determining a desired final value for the sheet resistance of thin film resistor material to be deposited on a substrate, depositing said thin film resistor material on said substrate using a deposition process which is consistent enough to achieve a target sheet resistance for the deposited thin film resistor material within a first specified tolerance, said thin film resistor material being deposited by said deposition process to achieve a target sheet resistance which is equal to said desired final value minus said first specified tolerance, removing a small amount of material uniformly from the surface of the deposited thin film resistor material by one of an etching and ion bombardment removing process to raise the sheet resistance to said desired final value within a second specified tolerance characteristic of said removing process, said second specified tolerance being less than said first specified tolerance, and patterning a thin film resistor from said thin film resistor material on said substrate.

7. The method according to claim 6, wherein said patterning is done before the sheet resistance is raised to said desired final value.

8. The method according to claim 6, wherein said patterning is done after the sheet resistance is raised to said desired final value.

9. A method for controlling the sheet resistance of thin film resistors, comprising:

determining a desired final value for the sheet resistance of thin film resistor material to be deposited on a substrate, depositing said thin film resistor material on said substrate using a deposition process selected from the group consisting of evaporation and sputter deposition which is consistent enough to achieve a target sheet resistance for the deposited thin film resistor material within a first specified tolerance, said thin film resistor material being deposited by said deposition process to achieve a target sheet resistance which is equal to said desired final value minus said first specified tolerance, and removing a small amount of material from the surface of the deposited thin film resistor material by one of an etching and ion bombardment removing process to raise the sheet resistance to said desired final value within a second specified tolerance characteristic of said removing process, said second specified tolerance being less than said first specified tolerance.

10. The method according to claim 1, wherein said small amount of material is removed uniformly from said surface of the deposited thin film resistor material in a time within the range of from about 10 seconds to several minutes.

11. A method for controlling the sheet resistance of thin film resistors, comprising:

determining a desired final value for the sheet resistance of thin film resistor material to be deposited on a GaAs integrated circuit substrate, depositing said thin film resistor material on said substrate using a deposition process which is consistent enough to achieve a target sheet resistance for the deposited thin film resistor material within a first specified tolerance, said thin film resistor material being deposited by said deposition process to achieve a target sheet resistance which is equal to said desired final value minus said first specified tolerance, and removing a small amount of material from the surface of the deposited thin film resistor material by one of an etching and ion bombardment removing process to raise the sheet resistance to said desired final value within a second specified tolerance characteristic of said removing process, said second specified tolerance being less than said first specified tolerance.

12. A method for controlling the sheet resistance of thin film resistors, comprising:

determining a desired final value for the sheet resistance of thin film resistor material to be deposited on an InP integrated circuit substrate, depositing said thin film resistor material on said substrate using a deposition process which is consistent enough to achieve a target sheet resistance for the deposited thin film resistor material within a first specified tolerance, said thin film resistor material being deposited by said deposition process to achieve a target sheet resistance which is equal to said desired final value minus said first specified tolerance, and removing a small amount of material from the surface of the deposited thin film resistor material by one of an etching and ion bombardment removing process to raise the sheet resistance to said desired final value within a second specified tolerance characteristic of said removing process, said second specified tolerance being less than said first specified tolerance.

13. A method for controlling the sheet resistance of thin film resistors, comprising:

determining a desired final value for the sheet resistance of thin film resistor material to be deposited on a substrate, depositing said thin film resistor material on said substrate using a deposition process which is consistent enough to achieve a target sheet resistance for the deposited thin film resistor material within a first specified tolerance, said thin film resistor material being deposited by said deposition process to achieve a target sheet resistance which is equal to said desired final value minus said first specified tolerance, and removing a small amount of material from the surface of the deposited thin film resistor material by an Argon sputter etching process to raise the sheet resistance to said desired final value within a second specified tolerance characteristic of said etching process, said second specified tolerance being less than said first specified tolerance.

14. A method for controlling the sheet resistance of thin film resistors, comprising:

depositing a thin film resistor material on a substrate using a deposition process which is consistent enough to achieve a target sheet resistance for the deposited thin film resistor material within a first specified tolerance, said thin film resistor material being deposited by said deposition process to achieve a target sheet resistance which is equal to a desired final value for the sheet resistance minus said first specified tolerance, measuring the sheet resistance of said deposited thin film resistor material, determining the thickness of said deposited thin film resistor material, calculating the thickness of said deposited thin film resistor material needed to be removed to raise the sheet resistance thereof to said desired final value, calculating the time for performing one of an etching and ion bombardment removing process to remove said calculated thickness based on a measured removal rate for said removing process, and performing said removing process for said calculated time to remove said calculated thickness of said deposited resistor material needed to be removed to raise the sheet resistance to said desired final value within a second specified tolerance characteristic of said removing process, where said second specified tolerance is less than said first specified tolerance.

* * * * *